(12) United States Patent
Dhindsa et al.

(10) Patent No.: US 7,712,434 B2
(45) Date of Patent: May 11, 2010

(54) APPARATUS INCLUDING SHOWERHEAD ELECTRODE AND HEATER FOR PLASMA PROCESSING

(75) Inventors: Rajinder Dhindsa, San Jose, CA (US); Eric Lenz, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 646 days.

(21) Appl. No.: 10/835,400

(22) Filed: Apr. 30, 2004

(65) Prior Publication Data
US 2005/0241765 A1    Nov. 3, 2005

(51) Int. Cl.
*C23C 16/509*   (2006.01)
*C23C 16/505*   (2006.01)
*C23F 1/00*   (2006.01)
*H01L 21/306*   (2006.01)
*C23C 16/06*   (2006.01)
*C23C 16/22*   (2006.01)

(52) U.S. Cl. .............................. 118/723 E; 118/723 R; 156/345.33; 156/345.34; 156/345.43

(58) Field of Classification Search .............. 118/723 E, 118/723 ER, 723 R; 156/345.43–47, 345.33, 156/345.34
See application file for complete search history.

(56) References Cited

U.S. PATENT DOCUMENTS

| | | | | |
|---|---|---|---|---|
| 4,612,077 A | * | 9/1986 | Tracy et al. ............. | 156/345.34 |
| 4,931,135 A | * | 6/1990 | Horiuchi et al. ............... | 216/67 |
| 4,963,713 A | * | 10/1990 | Horiuchi et al. ........ | 219/121.43 |
| 5,074,456 A | * | 12/1991 | Degner et al. ............... | 228/121 |
| 5,113,929 A | * | 5/1992 | Nakagawa et al. ............ | 165/61 |
| 5,350,480 A | * | 9/1994 | Gray ..................... | 156/345.26 |
| 5,445,709 A | * | 8/1995 | Kojima et al. ............... | 438/729 |
| 5,487,786 A | | 1/1996 | Chida et al. | |
| 5,534,751 A | | 7/1996 | Lenz et al. | |
| 5,558,717 A | * | 9/1996 | Zhao et al. ................. | 118/715 |
| 5,595,606 A | * | 1/1997 | Fujikawa et al. ............ | 118/725 |
| 5,641,735 A | | 6/1997 | Nitescu et al. | |
| 5,647,945 A | * | 7/1997 | Matsuse et al. ........ | 156/345.38 |
| 5,728,223 A | * | 3/1998 | Murakami et al. .......... | 118/715 |
| 5,766,364 A | * | 6/1998 | Ishida et al. ................ | 118/725 |
| 5,846,883 A | * | 12/1998 | Moslehi ..................... | 438/711 |
| 5,882,411 A | * | 3/1999 | Zhao et al. .................. | 118/715 |

(Continued)

FOREIGN PATENT DOCUMENTS

JP        2000306889 A  * 11/2000

(Continued)

OTHER PUBLICATIONS

Commonly Assigned U.S. Appl. No. 10/623,540, filed Jul. 22, 2003.

(Continued)

*Primary Examiner*—Rudy Zervigon
(74) *Attorney, Agent, or Firm*—Buchanan Ingersoll & Rooney PC

(57) ABSTRACT

A plasma processing apparatus includes a heater in thermal contact with a showerhead electrode, and a temperature controlled top plate in thermal contact with the heater to maintain a desired temperature of the showerhead electrode during semiconductor substrate processing. A gas distribution member supplies a process gas and radio frequency (RF) power to the showerhead electrode.

13 Claims, 11 Drawing Sheets

U.S. PATENT DOCUMENTS

| | | | | |
|---|---|---|---|---|
| 5,919,332 | A * | 7/1999 | Koshiishi et al. | 156/345.47 |
| 5,935,337 | A * | 8/1999 | Takeuchi et al. | 118/724 |
| 5,948,167 | A * | 9/1999 | Baek et al. | 118/723 E |
| 5,950,925 | A * | 9/1999 | Fukunaga et al. | 239/132.3 |
| 6,042,687 | A | 3/2000 | Singh et al. | |
| 6,056,823 | A * | 5/2000 | Sajoto et al. | 118/715 |
| 6,073,577 | A | 6/2000 | Lilleland et al. | |
| 6,123,775 | A | 9/2000 | Hao et al. | |
| 6,132,512 | A * | 10/2000 | Horie et al. | 118/715 |
| 6,194,322 | B1 | 2/2001 | Lilleland et al. | |
| 6,245,192 | B1 * | 6/2001 | Dhindsa et al. | 156/345.34 |
| 6,422,172 | B1 * | 7/2002 | Tanaka et al. | 118/723 R |
| 6,432,318 | B1 | 8/2002 | Ding et al. | |
| 6,453,992 | B1 * | 9/2002 | Kim | 165/206 |
| 6,460,482 | B1 * | 10/2002 | Kuibira et al. | 118/723 R |
| 6,506,686 | B2 * | 1/2003 | Masuda et al. | 438/715 |
| 6,508,913 | B2 | 1/2003 | McMillin et al. | |
| 6,537,928 | B1 * | 3/2003 | Matsuki et al. | 438/788 |
| 6,602,381 | B1 | 8/2003 | Lenz | |
| 6,630,772 | B1 | 10/2003 | Bower et al. | |
| 6,716,763 | B2 | 4/2004 | Li et al. | |
| 6,786,175 | B2 * | 9/2004 | Dhindsa et al. | 118/723 E |
| 6,800,139 | B1 * | 10/2004 | Shinriki et al. | 118/715 |
| 6,827,815 | B2 * | 12/2004 | Hytros et al. | 156/345.33 |
| 6,830,007 | B2 * | 12/2004 | Matsuki et al. | 118/723 ER |
| 6,883,733 | B1 * | 4/2005 | Lind | 239/424 |
| 6,899,786 | B2 * | 5/2005 | Senzaki et al. | 156/345.43 |
| 6,921,556 | B2 * | 7/2005 | Shimizu et al. | 427/248.1 |
| 6,946,033 | B2 * | 9/2005 | Tsuei et al. | 118/715 |
| 2003/0047282 | A1 * | 3/2003 | Sago et al. | 156/345.34 |
| 2003/0205202 | A1 * | 11/2003 | Funaki et al. | 118/723 E |
| 2004/0011770 | A1 | 1/2004 | Strang et al. | |
| 2004/0050492 | A1 * | 3/2004 | Tsuei et al. | 156/345.33 |
| 2004/0074609 | A1 * | 4/2004 | Fischer et al. | 156/914 |
| 2004/0187779 | A1 * | 9/2004 | Park et al. | 118/715 |
| 2005/0000423 | A1 * | 1/2005 | Kasai et al. | 118/715 |
| 2005/0003600 | A1 * | 1/2005 | Kasai et al. | 438/200 |

FOREIGN PATENT DOCUMENTS

| | | | |
|---|---|---|---|
| JP | 2003158120 | A * | 5/2003 |
| JP | 2003257937 | A * | 9/2003 |

OTHER PUBLICATIONS

Commonly Assigned U.S. Appl. No. 10/645,665, filed Aug. 22, 2003.
International Preliminary Report on Patentability dated Nov. 9, 2006 for PCT/US2005/012221.

* cited by examiner

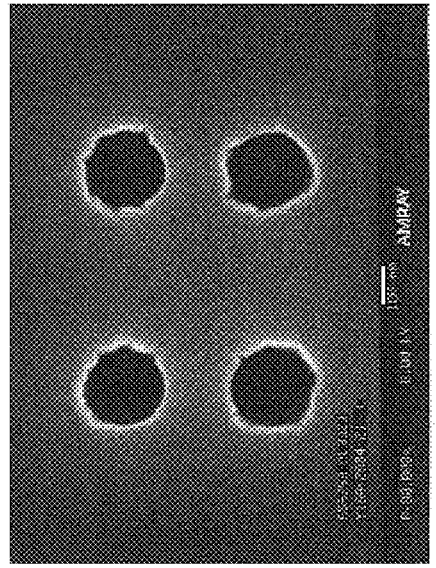
FIG. 9A — 70°C
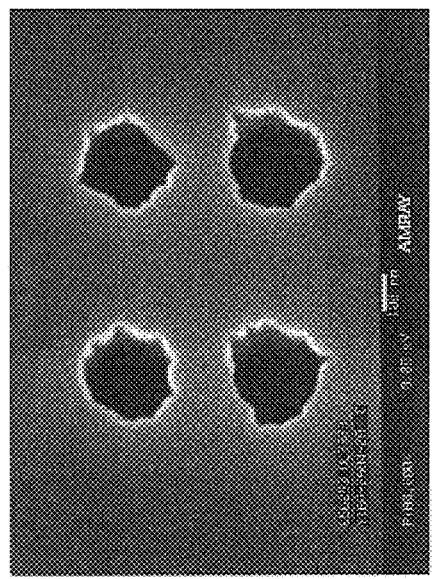
FIG. 9B — 90°C
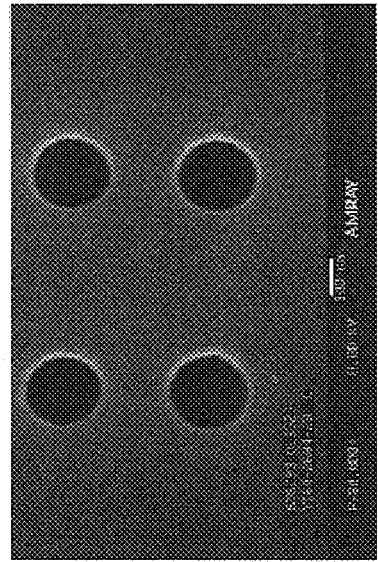
FIG. 9C — 105°C
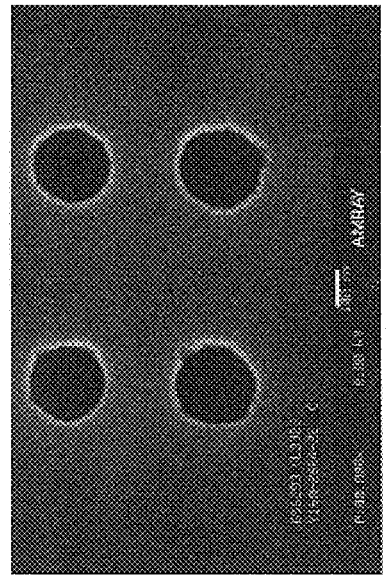
FIG. 9D — 130°C

APPARATUS INCLUDING SHOWERHEAD ELECTRODE AND HEATER FOR PLASMA PROCESSING

BACKGROUND

Plasma processing apparatuses are used to process substrates by techniques including etching, physical vapor deposition (PVD), chemical vapor deposition (CVD), ion implantation, and ashing or resist removal. Recently, due to shrinking feature sizes and the implementation of new materials, improvement in plasma processing apparatuses to control the conditions of the plasma processing is required.

SUMMARY

A plasma processing apparatus is provided which includes a showerhead electrode and a heater in thermal contact with the showerhead electrode, wherein the heater is operable to heat at least a portion of the showerhead electrode above a threshold temperature. Additionally, a top plate may also be provided in the apparatus to control the temperature of the showerhead electrode or cooperate with the heater to maintain a predetermined temperature in the showerhead electrode.

In one embodiment a showerhead electrode assembly includes a showerhead electrode adapted to be mounted in an interior of a vacuum chamber; a radio frequency (RF) distribution member attached to the showerhead electrode, wherein the RF distribution member includes a first portion adapted to extend axially into an opening in a temperature controlled top wall of the vacuum chamber, and the RF distribution member includes a second portion extending laterally over the showerhead electrode, and providing a RF path and a thermal path; and a thermal path member attached to the RF distribution member and adapted to provide a thermal path between the top wall of the vacuum chamber and the second portion of the RF distribution member to the showerhead electrode. In another embodiment, the RF distribution member can also include at least one gas passage supplying process gas to the showerhead electrode.

In another embodiment, a showerhead electrode assembly includes a showerhead electrode adapted to be mounted in an interior of a vacuum chamber; a gas distribution member attached to the showerhead electrode; a thermal path member attached to the gas distribution member; and a heater attached to the thermal path member, wherein the heater transmits heat to the showerhead electrode through the gas distribution member and the thermal path member. In another embodiment, the gas distribution member can be an electrically conductive material which distributes RF power to the showerhead electrode.

Also provided is a method of controlling plasma etching, including applying power to a heater in a plasma etching chamber; heating at least a portion of a showerhead electrode in the plasma etching chamber to a predetermined temperature by conducting heat from the heater to the showerhead electrode; supplying process gas to the plasma etching chamber through the showerhead electrode; and etching a semiconductor substrate in the plasma etching chamber by applying RF power to the showerhead electrode and energizing the process gas into a plasma state, wherein the power applied to the heater and the power applied to the showerhead electrode are electrically isolated from one another by a thermal path member.

BRIEF DESCRIPTION OF THE DRAWING FIGURES

FIGS. 9a-d are photomicrographs taken at 80,000× magnification of a patterned photoresist.

Figure 10:
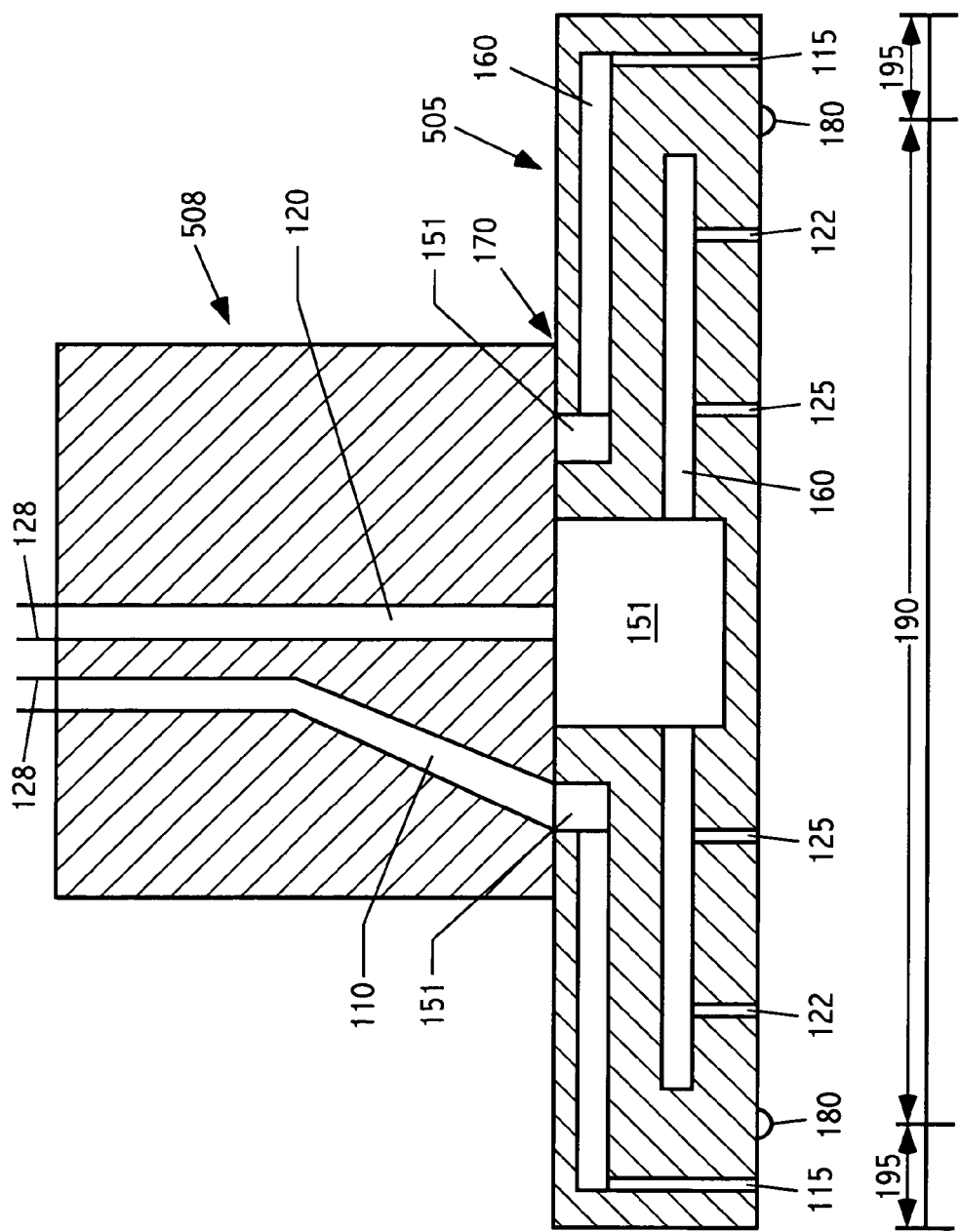
Figure 11:
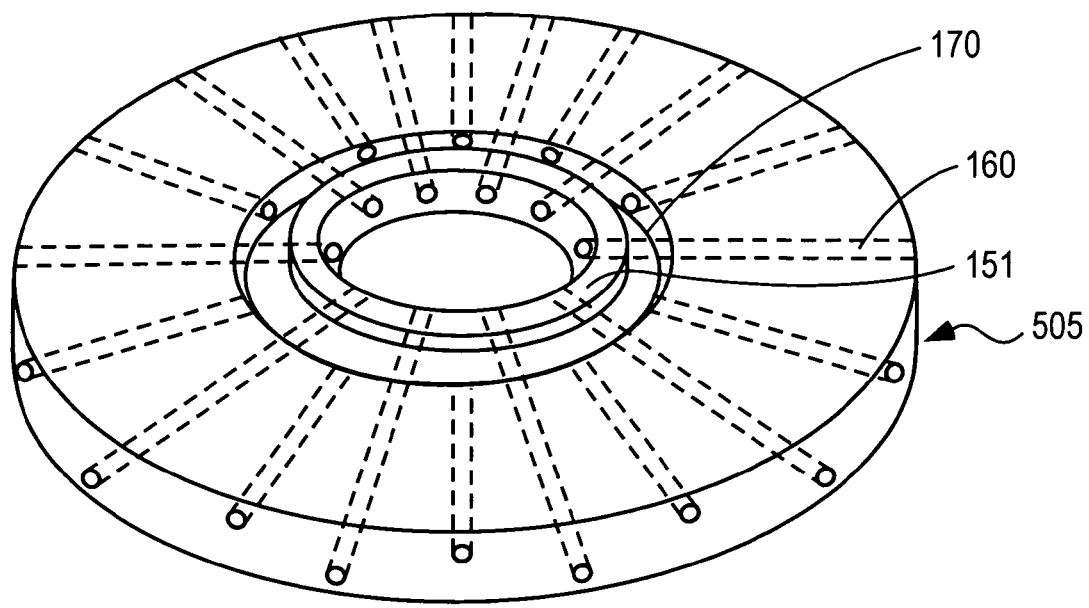

FIGS. 10 and 11 illustrate preferred embodiments of a gas distribution member.

Figure 12:
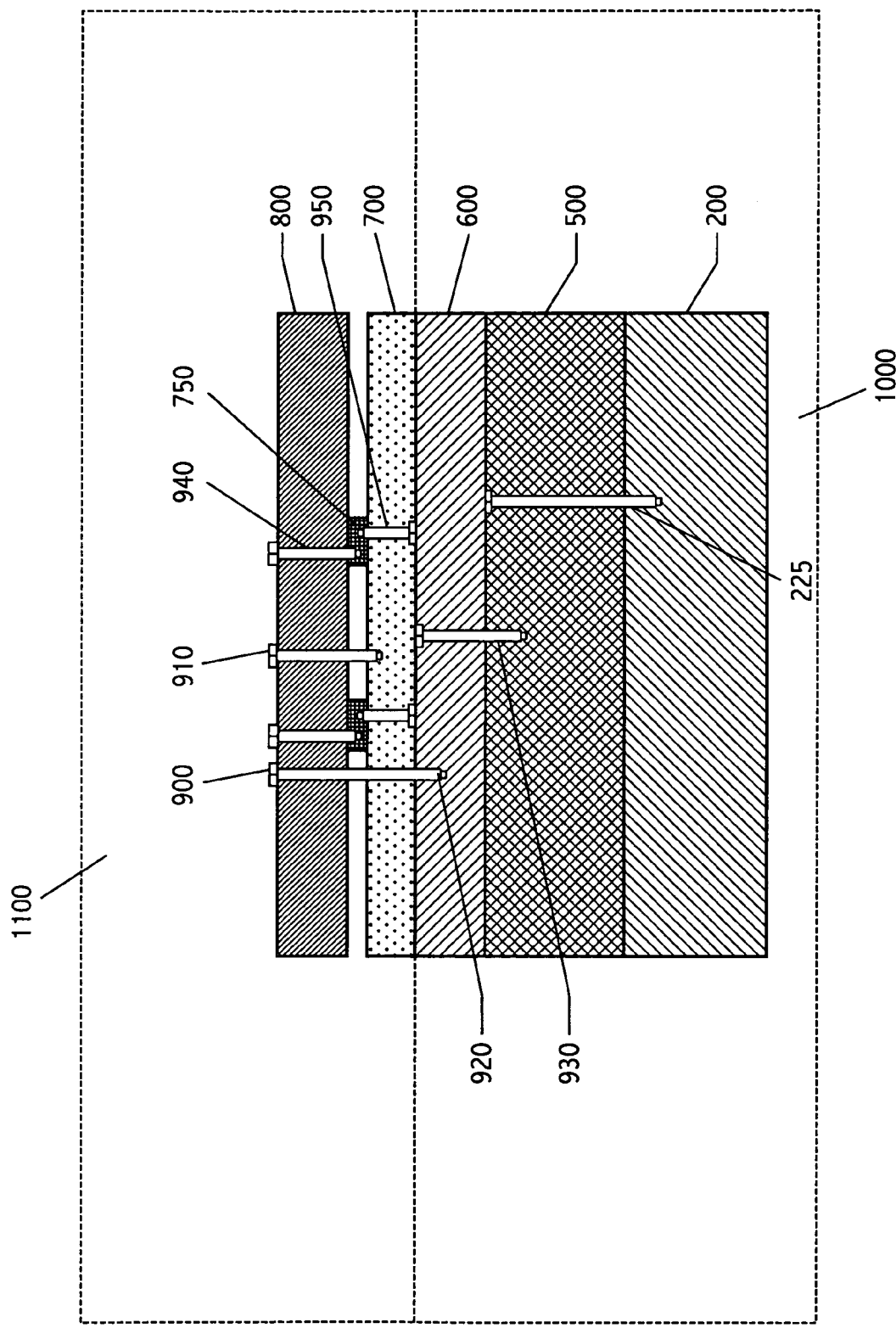

FIG. 12 illustrates a preferred embodiment of subassembly attachments.

DETAILED DESCRIPTION

Control over plasma parameters, such as plasma chemistry, ion energy, density, and distribution, electron temperature, etc., is desired to alter plasma processing results. In addition to these plasma parameter controls, temperatures of surfaces in a plasma chamber which confine plasma may also be used to control plasma chemistry and hence the plasma processing results on a semiconductor substrate such as a wafer.

The temperature of a showerhead electrode used in a plasma etch process (such as oxide etching) can vary widely. When etching a series of wafers in a single wafer plasma etch chamber, it has been observed that temperatures of various portions of a radio frequency (RF) powered showerhead electrode vary over time and a central portion of the showerhead electrode can become more heated than edge portions due to heat generated by the RF powered showerhead electrode. For example, the temperature difference between the center and the edge of the showerhead electrode can be about 100° C. or higher. This variation in temperature is more pronounced when the electrode is run at higher power levels (e.g., 3,000 to 6,000 watts) and can lead to non-uniformity in plasma etching. Thus, decreasing the variation in the temperature of the RF powered showerhead electrode can provide more uniform plasma etching of wafers during a production run. In addition, maintaining a minimum temperature of the RF powered electrode during a production run can improve photoresist selectivity.

In light of the fluctuation in temperature of a RF powered showerhead electrode from the heat generated during use, a heater is provided to maintain the center and edge portion of RF powered showerhead electrode within a desired temperature range, e.g., less than 50° C., preferably less than 25° C. variation in temperature from center to edge. By heating the RF powered showerhead electrode in cooperation with cooling from a temperature controlled member such as a top wall (top plate) of the chamber, a desirable temperature distribution may be provided in a RF powered showerhead electrode during operation of a plasma processing apparatus. According to a preferred embodiment, the temperature difference between the center portion and the edge portion of a showerhead electrode can be maintained in a range effective to improve uniformity of plasma processing such as plasma etching high aspect ratio openings in dielectric material such as silicon oxide.

In a preferred embodiment, a plasma processing apparatus includes the heater, a temperature controlled heat sink and a showerhead electrode, where the showerhead electrode is RF powered. The plasma processing apparatus of this embodiment allows for the temperature of the showerhead electrode to be controlled by active heating and active cooling of the showerhead electrode.

Figure 1:
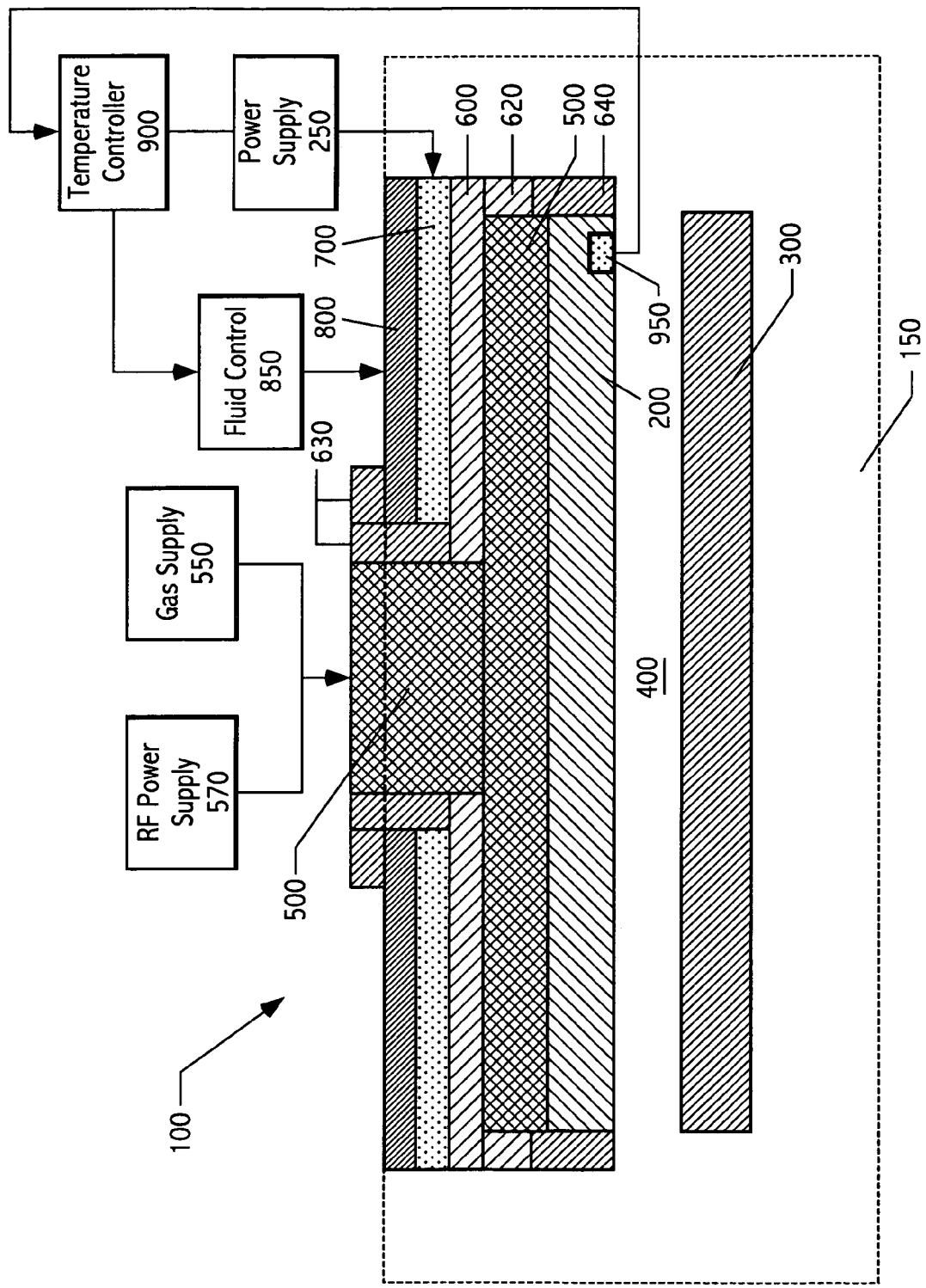
FIGS. 1, 2, 4 and 5 illustrate preferred embodiments of showerhead electrode assemblies.

FIG. 1 shows a cross-sectional view of a plasma processing apparatus 100 according to a first embodiment, which includes a heater and an upper showerhead electrode temperature control system. In FIG. 1, a plasma processing apparatus 100 is provided with a heater 700 in a vacuum chamber 150 and a temperature controller 900.

As illustrated in FIG. 1, a vacuum chamber 150 such as a plasma etch chamber includes an upper showerhead electrode 200 and a substrate support 300 therein, the upper showerhead electrode 200 and the substrate support 300 being separated by the gap 400 within which a substrate is processed. The upper showerhead electrode 200 includes a perforated or porous planar or non-planar surface to dispense reactant gases over an exposed surface of the substrate. Above the upper showerhead electrode 200, a gas distribution member 500 is provided, where the gas distribution member 500 supplies a process gas to the upper showerhead electrode 200 from a gas supply 550 outside the vacuum chamber 150. The gas distribution member 500 is also electrically conductive and distributes RF power from a RF power supply 570 outside the vacuum chamber 150 to the upper showerhead electrode 200.

Also, as illustrated in FIG. 1, a heater 700 is located above a horizontally extending portion of the gas distribution member 500, where the heater 700 provides heat to the upper showerhead electrode 200 through the gas distribution member 500 and a thermally conductive insulator (or thermal path member) 600, where the insulator 600 is provided between the heater 700 and the gas distribution member 500. The insulator 600 is a thermally conductive, electrically insulating body which functions to electrically insulate the heater 700 from the gas distribution member 500, while allowing heat from the heater 700 to be conducted to the gas distribution member 500. Thus, the RF power transmitted through the gas distribution member 500 is electrically isolated from power supplied to the heater 700, while still allowing thermal conduction between the heater 700 and the upper showerhead electrode 200.

In order to control the temperature of the upper showerhead electrode 200, a temperature controller 900 is provided which uses any suitable temperature monitoring arrangement such as at least one temperature sensor 950 to measure the temperature (T) of the upper showerhead electrode 200. The temperature sensor 950 can include a fiber optic temperature sensing element located in close proximity to a backside of the upper showerhead electrode 200 or the temperature sensor 950 can be thermally connected to the upper showerhead electrode 200. For example, as illustrated in FIG. 1, the temperature sensor 950 is located on the vicinity of an edge portion of the upper showerhead electrode 200. The temperature controller 900 can be used to determine, based on data/ signals representing temperature T of the upper showerhead electrode 200 provided by the temperature sensor 950, whether the temperature of the upper showerhead electrode 200 must be increased to a predetermined temperature (Tp). If T is less than Tp, the temperature controller 900 is operable to activate a power supply 550, which provides power to the heater 700, thus increasing the temperature of the heater 700, which in turn increases the temperature of the upper showerhead electrode 200.

The heater 700 may be powered by an alternating current (AC) or direct current (DC) power supply 250, where the AC or DC power supply 250 is controlled by the temperature controller 900, as mentioned above.

Also, as illustrated in FIG. 1, the heater 700 is supported by a temperature controlled top plate 800 which forms a vacuum sealed upper wall of the chamber. The top plate 800 is electrically grounded and can be provided with a fluid control apparatus 850, which is also controlled by the temperature controller 900 and can include a temperature chiller to cool fluid run through the top plate 800. Alternatively, the top plate 800 can be cooled in a continuous or discontinuous manner without the fluid control apparatus 850. For example, water may be run continuously through the top plate 800 without a fluid control apparatus 850 being used.

If the temperature controller 900 is used, the temperature of the top plate can be adjusted as desired. For example, if T is more than Tp, the temperature controller 900 can cause the fluid control apparatus 850 to flow a cooling fluid through the top plate 800 to cool the heater 700 which then acts as a heat sink for the upper showerhead electrode 200 and thus cools the upper showerhead electrode 200, as discussed below. However, the fluid passing through the top plate 800 can be circulated continuously and the temperature of the fluid can optionally be raised or lowered and/or the flow rate of the fluid can be increased or decreased based on instructions from the temperature controller 900.

Additionally, as illustrated in FIG. 1, upper electrical insulators 630 are used to electrically insulate the top plate 800 from the gas distribution member 500. Also, lateral electrical insulators 620, 640 surrounding the upper showerhead electrode 200 and gas distribution member 500 are used to electrically insulate the upper showerhead electrode 200 from the heater 700.

The substrate support 300 includes a lower electrode and an optional electrostatic chuck (ESC) on an upper surface thereof opposite from the upper showerhead electrode 200 in the apparatus 100. Accordingly, a substrate subjected to plasma processing may be supported with or without being mechanically or electrostatically clamped on an upper surface of the substrate support 300.

Figure 2:
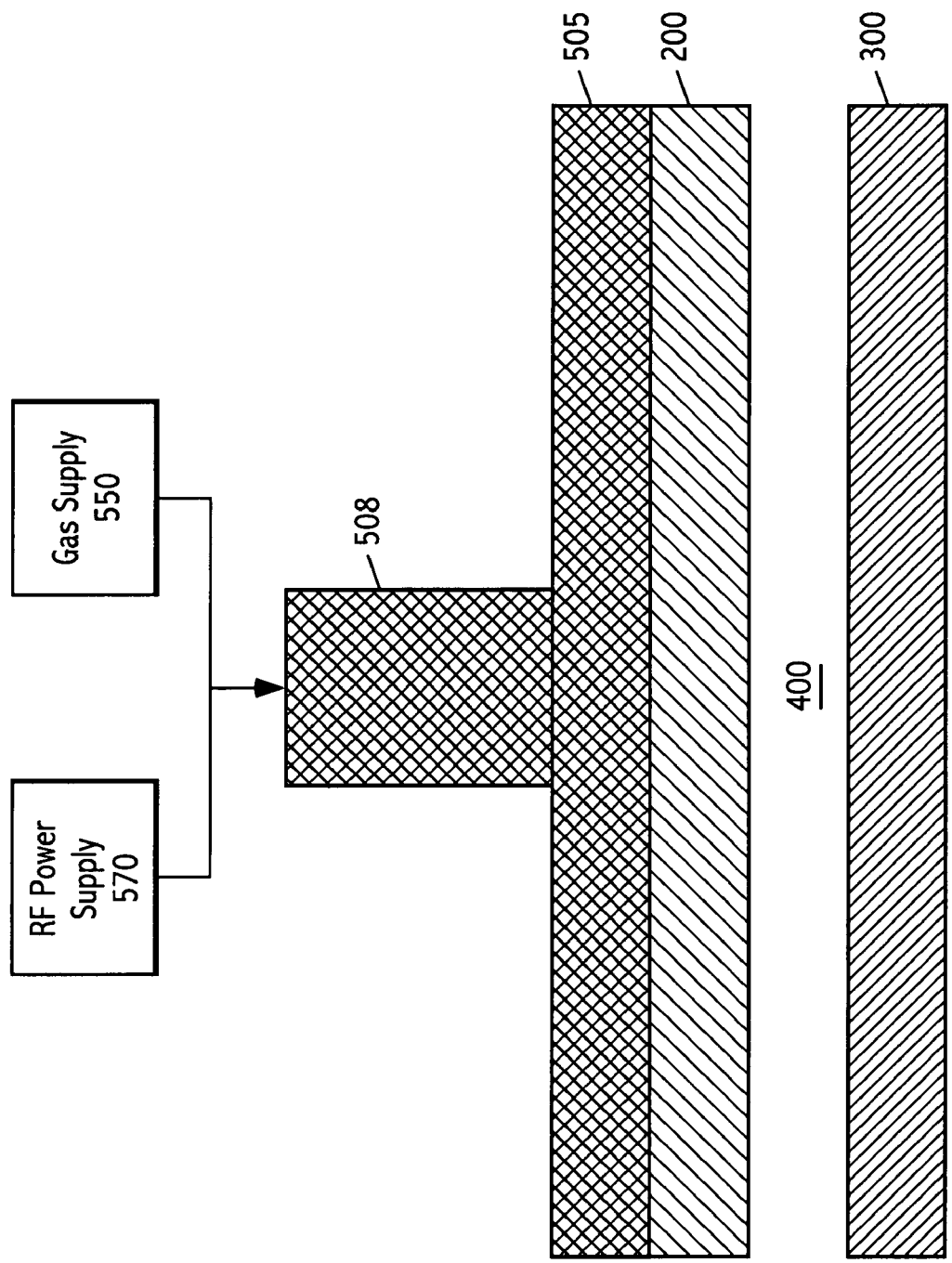

In a second embodiment, as illustrated in FIG. 2, the apparatus 100 can incorporate the gas distribution member 500 (made up of an axially extending member 508 and a plate 505) without the heater 700, where the gas distribution member 500 can be RF insulated within the apparatus 100 from other parts of the plasma etching chamber. In this embodiment, the gas distribution member 500 can be RF insulated using the insulator 600 and/or other insulating members as desired to allow RF to penetrate through the gas distribution member 500.

Also in the second embodiment, the gas distribution member 500 is illustrated as a combination of a plate 505 and an axially extending member 508, where the axially extending member 508 includes a RF connection to receive a cable electrically connected to the RF power supply 570. Thus, the axially extending member 508 is used to distribute RF power from the RF power supply 570 to the plate 505 then to the upper showerhead electrode 200 through contact points between the plate 505 and the upper showerhead electrode 200. For example, the plate 505 can include a plurality of annular projections (or contact points, as will be discussed below) in contact with a facing surface, or the backside of the upper showerhead electrode 200.

The axially extending member 508 additionally functions to distribute process gas from the gas supply 550 to one or more plenums between the plate 505 and the upper showerhead electrode 200. As such, both RF power and process gas are supplied to the upper showerhead electrode 200 through the gas distribution member 500. By supplying RF power through the gas distribution member 500, the RF power can be supplied more uniformly over the upper showerhead electrode 200 so as to reduce temperature variations from center to edge across the exposed surface of the upper showerhead electrode 200. Also, by supplying process gas through the member 500 it is possible to deliver process gas at desired flow rates to one or more zones in the chamber.

Figure 3:
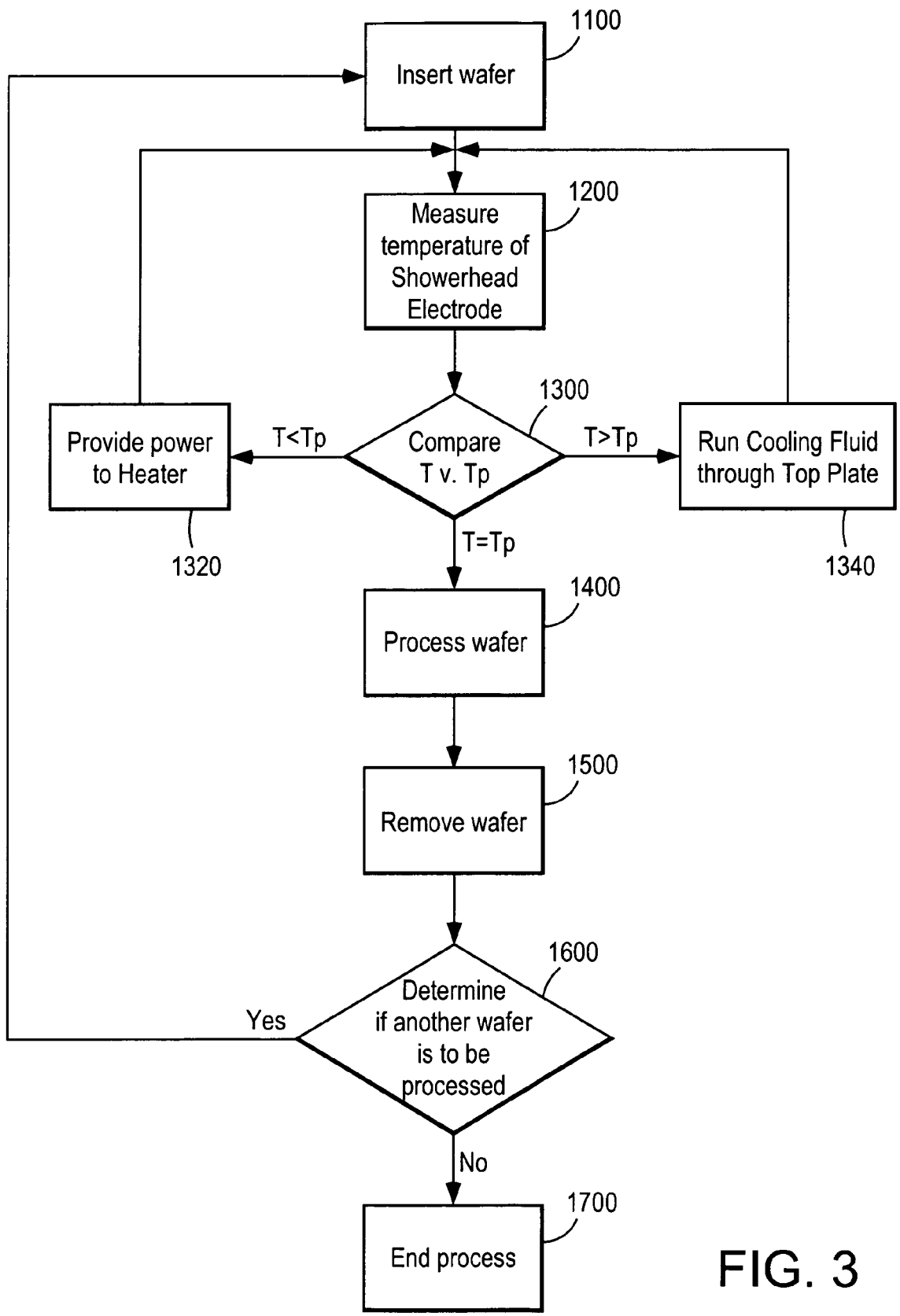
FIG. 3 illustrates a preferred method of operating a showerhead electrode assembly.

In FIG. 3, a preferred method of operating the apparatus 100 of the third preferred embodiment is illustrated. As shown in FIG. 3, the method begins with a step 1100 of inserting a wafer onto the support 300. Next, in step 1200 the temperature sensor 950 in the upper showerhead electrode 200 measures the temperature of the upper showerhead electrode 200.

Next, in step 1300 the temperature controller 900 compares the measured temperature (T) with a predetermined temperature range (Tp), where the predetermined temperature range corresponds to the desired temperature for the upper showerhead electrode 200. If T is less than Tp, then in step 1320 power is provided to the heater in order to heat the upper showerhead electrode 200 a predetermined amount, then step 1200 is repeated to determine if the amount of power supplied to the heater 700 was appropriate. If T is more than Tp, in step 1340 a cooling fluid is run through the top plate and step 1200 is repeated to determine if the amount of cooling fluid run through the top plate 800 was appropriate. If T is about the same as Tp, then the wafer is processed in step 1400 and removed in step 1500 before it is determined whether another wafer is to be processed in step 1600. If no other wafers are to be processed, the process ends in step 1700, but if another wafer is to be processed, the process repeats and a wafer is inserted in step 1100.

It is noted that the temperature controller can be any type of information processor, such as a stand-alone computer or an internal logic switch.

Also, it is noted that the amount of power and cooling fluid provided can be varied as desired depending on the process and the operating conditions. For example, if T is much less than Tp, then more power can be provided to the heater 700 at step 1320 than if T is slightly less than Tp.

Figure 4:
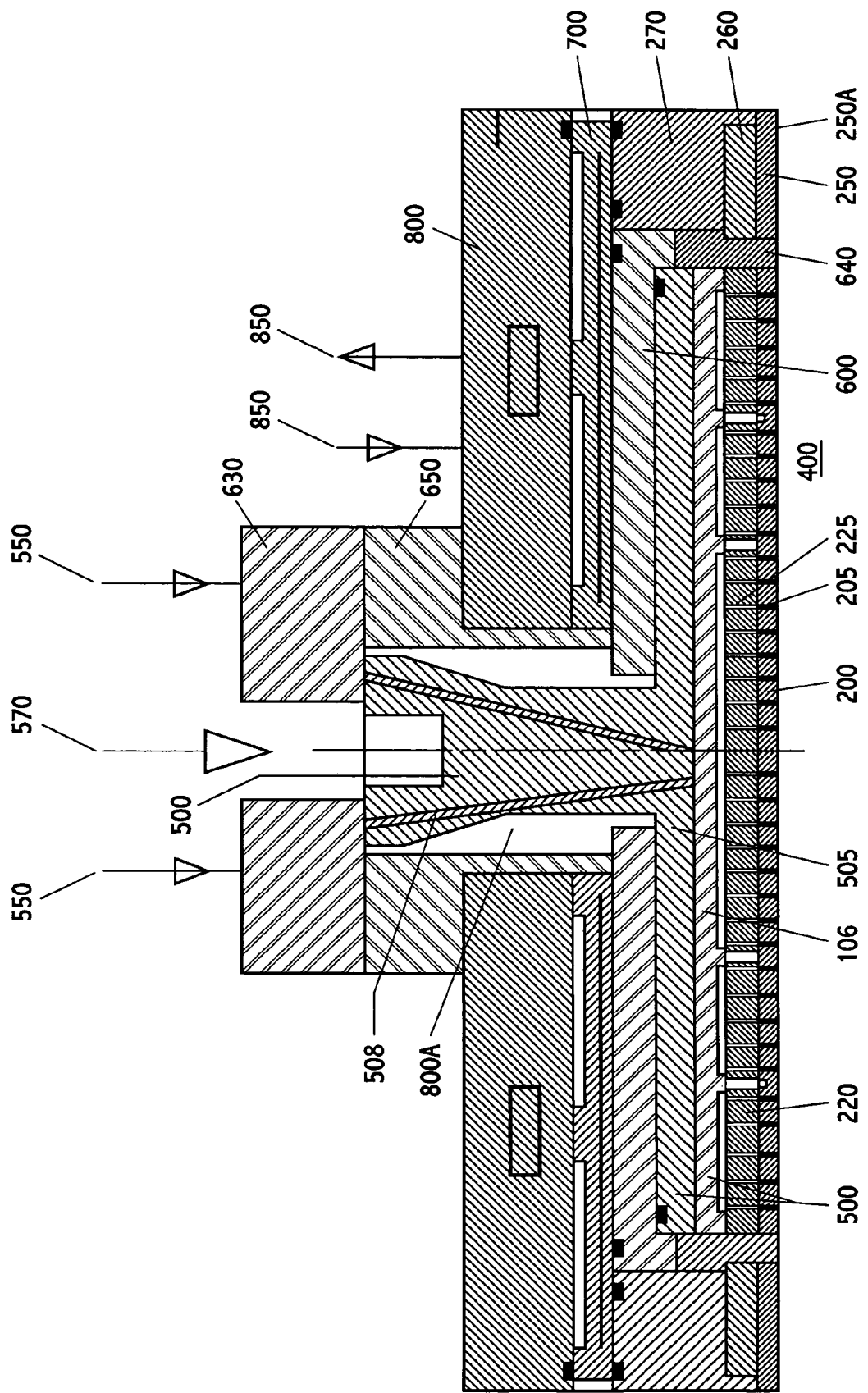

A third embodiment is illustrated in FIG. 4. In FIG. 4, in addition to the components of the first embodiment, the upper showerhead electrode 200 is illustrated with a backing member 220 (such as a graphite plate elastomer bonded to the electrode 200), where the gas distribution member 500 is attached to the backing member 220 (e.g., member 500 can be fastened to the member 220 by bolts or other fasteners). For example, the backing member 220 may be provided to enhance structural support of the electrode 200 and can be attached to the gas distribution member 500 with contact bolts 225, discussed below. Additionally, a secondary insulator 650, which is electrically insulating, is provided on an outer lateral region of the axially extending member 508 and inner lateral regions of the heater 700 and the top plate 800 (including opening 800A), in addition to the upper and lateral electrical insulators 630, 640 mentioned above.

In the third embodiment, the backing member 220 is preferably attached to a backside of the upper showerhead electrode 200 by elastomer bonding (for example, see commonly assigned U.S. Pat. Nos. 6,194,322 B1 and 6,073,577, which are hereby incorporated by reference in their entirety). The member 220 includes gas passages 226 aligned with gas passages 206 in the upper showerhead electrode 200 to provide gas flow into the gap 400. The top plate 800 forms a removable and vacuum sealed top wall of the apparatus 100 and functions as a heat sink which cooperates with the heater 700 to control the temperature of the upper showerhead electrode 200.

The backing member 220 is preferably made of a material that is chemically compatible with process gases used for processing semiconductor substrates in the plasma processing chamber, has a coefficient of thermal expansion closely matching that of the electrode material, and/or is electrically and thermally conductive. Preferred materials that can be used to make the backing member 220 include, but are not limited to, graphite and silicon carbide (SiC).

The third embodiment also features a ground electrode 250 surrounding electrode 200. This outer electrode member 250 includes exposed surface 250A and is useful for larger wafer processing such as 300 mm wafers, and the outer electrode member 250 is also provided with a backing ring 260 and an electrically grounded ring 270 located on the outer electrode member 250 adjacent to the insulator 600 and a lateral electrical insulator 640. Further details of this electrode arrangement can be found in commonly assigned U.S. patent application Ser. No. 10/645,665, the subject matter of which is hereby incorporated by reference. If desired, the chamber can include a plasma confinement arrangement surrounding gap 400, details of which can be found in commonly assigned U.S. Pat. Nos. 6,602,381 B1 and 5,534,751, which are hereby incorporated by reference herein in their entirety.

Figure 5:
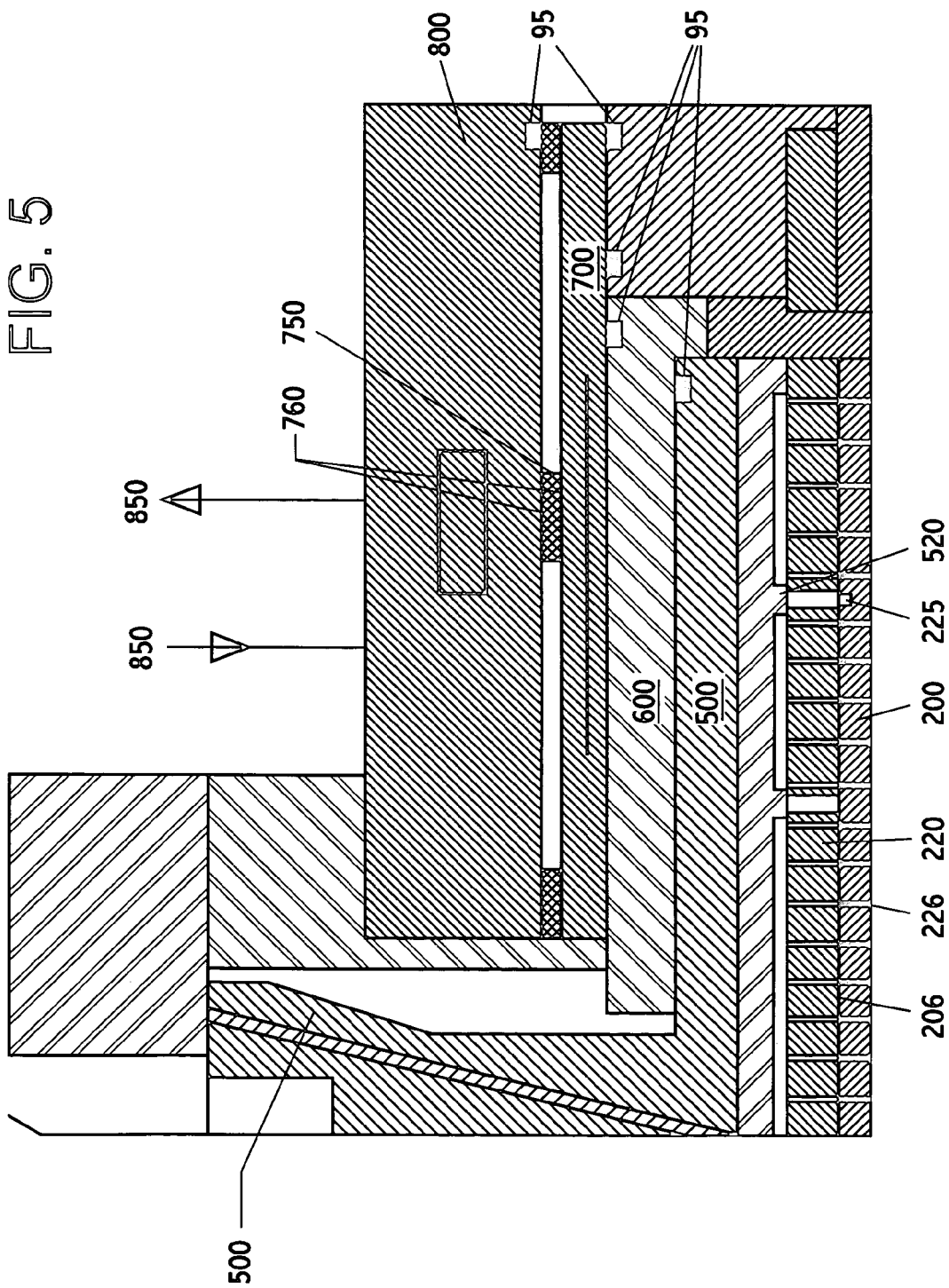
Figure 6:
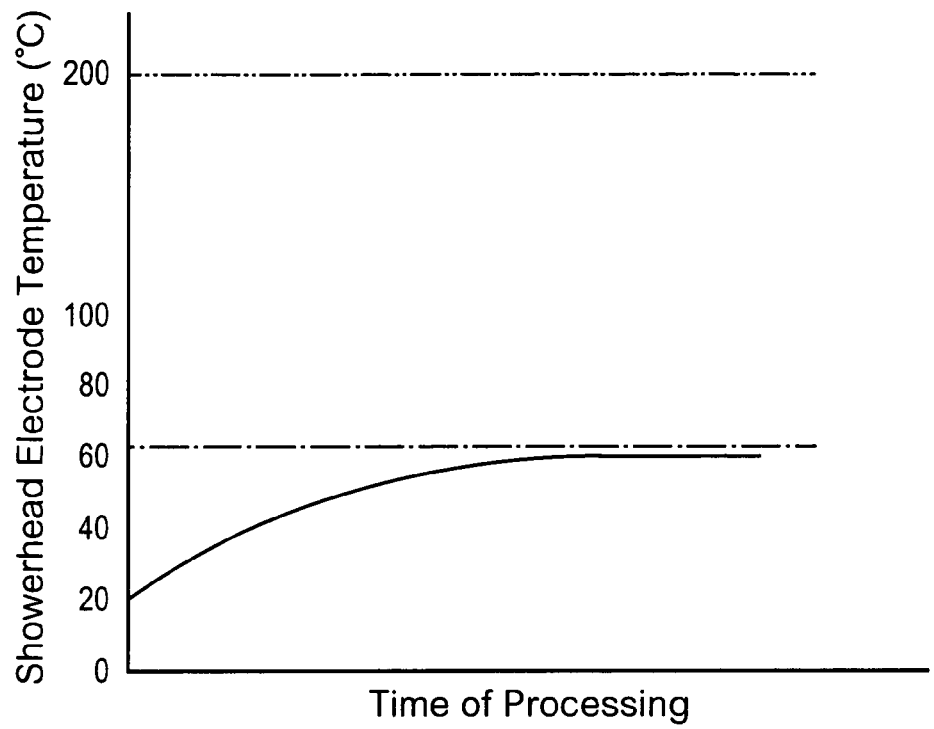
FIG. 6 illustrates temperatures at which a preferred showerhead electrode embodiment is operated.

Further, as illustrated in FIG. 5, which is an enlarged portion of FIG. 4, contact points 520 between the backing member 220 and the gas distribution member 500 (the gas distribution member 500 being shown as a three piece member in FIGS. 4 and 5 and further discussed below) are shown as protrusions from the gas distribution member 500 toward the upper showerhead electrode 200 and the backing member 220. The contact points 520 are illustrated as concentric rings in cross-section in FIG. 5 that protrude from the gas distribution member 500. However, the contact points 520 may be continuous or discontinuous rings, spaced individual points or any other shaped member capable of transmitting RF power and conducting heat therethrough. If continuous contact point rings are used, channels can be provided in the rings in order to allow for gaseous communication between plenums formed between the rings and the backside of the showerhead electrode. On the other hand, the channels may be omitted if cross-communication is not desired and therefore gases on one side of the contact point rings are intended to be isolated from gases on the other side of the rings. For example, as illustrated in FIG. 4, three concentric rings are provided between the gas distribution member 500 and the upper showerhead electrode 200.

Each contact point 520 of the gas distribution member 500 can have a contact area depending upon the amount of RF and thermal conductivity desired, as well as the area desired to supply gas from the gas distribution member 500 to the upper showerhead electrode 200. For example, as illustrated in FIG. 5, plenums between the gas distribution member 500 and the backing member 220 allow for gas passage therebetween while contact points 520 allow for RF and thermal conductivity.

Preferably, the contact area provided by the contact points 520 between the gas distribution member 500 and the upper showerhead electrode 200 is on the order of 0.1% to 99.9% of the total surface area of the gas distribution member 500, e.g., 1 to 5%, 5 to 15%, 15 to 30%, 30 to 45%, 45 to 60%, 60 to 75%, 75 to 90% or 90 to 99.9%.

In an exemplary embodiment, the contact points 520 are provided as four integrally formed continuous rings each of which is 0.5 inch wide. In this embodiment, the first ring has an inner diameter of about 2.5" and an outer diameter of 3", the second ring has an inner diameter of about 5" and an outer diameter of 5.5", the third ring has an inner diameter of about 8" and an outer diameter of 8.5" and the fourth ring has an inner diameter of about 11" and an outer diameter of 11.5" on a gas distribution member 500 with an outer diameter of about 12.2", where the upper showerhead electrode 200 has approximately the same diameter as the gas distribution member 500. In this embodiment, the contact area is from 15 to 20% of the total area of the gas distribution member 500.

Additionally, the upper showerhead electrode 200 can have a few gas outlets or many gas outlets of any desired dimension or configuration depending on the reactor and/or the process carried out therein, where the gap 400 can be any desired spacing, e.g., 1" to 10", 2" to 5" or 3" to 6". For example, if the gap is large, e.g., about 6 cm or more, only a few gas outlets can be provided at the center of the upper showerhead electrode 200 while providing a high contact area, e.g., over 90%, such as about 99%, between the gas distribution member 500 and the upper showerhead electrode 200.

Additionally, contact bolts 225 are also illustrated, where the contact bolts 225 secure the upper showerhead electrode 200 and the backing member 220 to the gas distribution member 500, where the gas distribution member 500 supports the backing member 220 and the upper showerhead electrode 200. For instance, contact bolts 225 passing through the member 500 can be threaded into threaded holes in member 220.

The temperature of the electrode 200 can be further controlled, in addition to using a heater 700, top plate 800, temperature sensor 950, power supply and temperature controller 900, by also controlling temperature conduction between the heater 900 and the top plate 800.

For example, as illustrated in FIG. 5, the heater 700 may include projections forming thermal chokes 750 or the apparatus 100 may include thermal chokes 750 separate from the heater 700, which are preferably choke rings. The thermal chokes 750 in either form provide a resistance to heat flow and inhibit thermal conduction between the heater 700 and the top plate 800, where in order to control the heat flow, the size and the material of the thermal chokes 750 can be adjusted. For example, the thermal chokes 750 can be narrower or can be made of a less thermally conductive material if less heat flow is desired.

Preferably, the thermal chokes 750 are sized to control the thermal conductivity, where the contact area between the thermal chokes 750 and the heater 700 can range from 1% to 100% of the area of the heater, e.g., 1 to 5%, 5 to 15%, 15 to 30%, 30 to 45%, 45 to 60%, 60 to 75%, 75 to 90% or 90 to 100%.

In an exemplary embodiment, the thermal chokes 750 are provided as three discrete continuous rings each of which is 1 inch wide. In this embodiment, the first ring has an inner diameter of 3" and an outer diameter of 4", the second ring has an inner diameter of 10.5" and an outer diameter of 11.5" and the third ring has an inner diameter of about 15.6" and an outer diameter of 16.6" on a heater 700 with an inner diameter of 3" and an outer diameter of 16.7". In this embodiment, the contact area between the thermal chokes 750 and the heater 700 range from 20 to 25% of the total area of the heater 700.

The thermal chokes 750 can be made of any material, but are preferably made of a material the same or lower thermal conductivity than the material used for the heater 700 and/or the top plate 800. For example, the thermal chokes 750 can be made of aluminum or stainless steel, but are preferably made of stainless steel which has a lower thermal conductivity in the case where the heater 700 and top plate 800 are made of aluminum or an aluminum alloy.

Also, the heater 700 may be attached to the top plate 800 with fasteners that may extend through oversized openings (not shown) in the top plate 800 and into threaded openings in the surface of the thermal chokes 750 in the case where the thermal chokes 750 are integral with the heater 700. In the case where the thermal chokes 750 are separate pieces from the heater 700, the thermal chokes 750 can be attached to the top plate 800 as indicated above and additional bolts passing through openings in the thermal chokes 750 can be threaded into threaded openings in the heater 700.

In the case where the attachment bolts are not sealed on the outside of the top plate, the points of attachment to the thermal chokes, heater and showerhead assembly can be confined to vacuum sealed areas. For instance, as illustrated in FIG. 5, such vacuum sealed areas may be provided between the heater 700 and the top plate 800 by O-rings 95. O-rings can also be located between various components. For example, 0-rings 95 may be used to create vacuum sealed areas between the top plate 800 and the heater 700, the heater 700 and the insulator 600, the insulator 600 and the gas distribution member 500, and/or the heater 700 and the electrically grounded ring 270.

Also, as mentioned above, the upper showerhead electrode 200 is preferably RF powered. However, the upper showerhead electrode 200 (and the lower electrode) may be electrically grounded or powered, where the power is provided preferably by a radio-frequency (RF) or a direct current (DC) power source. Preferably for plasma processing, one electrode is RF powered with RF power at two or more frequencies (e.g., 2 MHz and 27 MHz) while the other electrode is grounded. See, for example, commonly-assigned U.S. Pat. No. 6,391,787, the entire disclosure of which is hereby incorporated by reference.

In a fourth embodiment, the temperature of an upper showerhead electrode is controlled to minimize striations formed in openings in openings in patterned photoresists (PR), which are used in etching features in layers such as silicon oxide, for example, features such as high aspect ratio contacts (HARC). One problem arising in etching of narrow features is that striations may occur on the overlying PR sidewalls. The striations are vertically extending irregularities that result in a rough PR sidewall. Since the PR is being used as a mask in etching, such irregularities are transferred to the underlying layer. Striations in underlying layers, such as silicon oxide, make it difficult to fill materials, such as metals, into an etched feature and may introduce reliability and performance problems with the irregularly shaped feature. For these reasons, it is desirable to provide an oxide etching process that is selective to photoresist, does not produce etch stop, and reduces the occurrence of striations.

Figure 7:
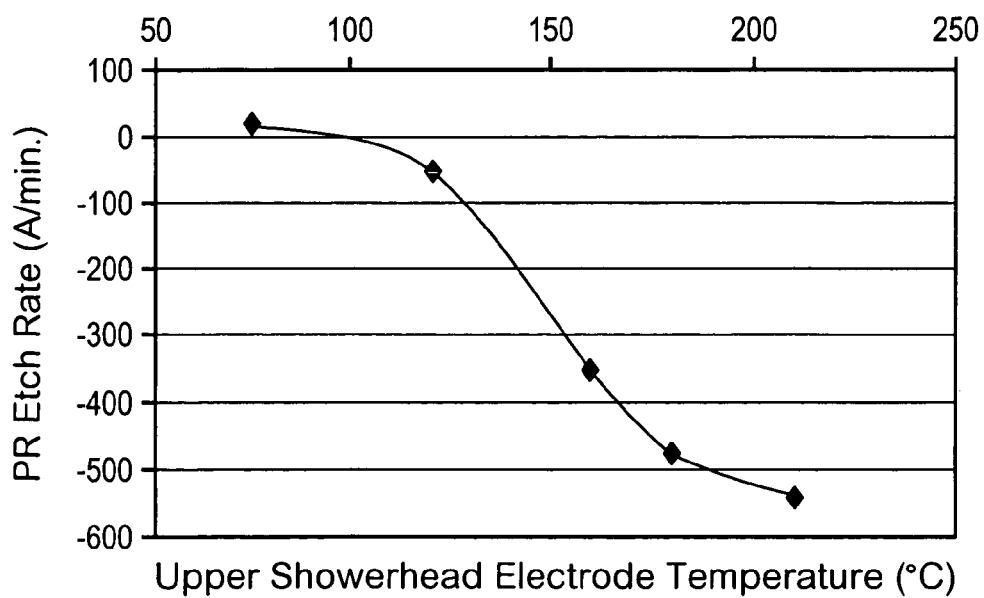
FIG. 7 illustrates the effect of showerhead electrode temperatures on an exemplary photoresist etch rate.

The temperature of the upper showerhead electrode can be maintained at an elevated temperature to minimize the etching rate of the PR thus minimize the loss of PR and the degree of striations in the PR. For example, as shown in FIG. 7, by using a heater 700 in combination with the upper showerhead electrode 200, an increase in temperature from about 75° C. to about 225° C. of an exemplary upper showerhead electrode leads to deposition of polymer and polymer buildup on the PR, i.e., a decrease in etch rate of the PR from about 20 Å/min to about minus 540 Å/min where the negative etch rate corresponds to deposition of polymer and polymer build up on the PR.

Figure 8:
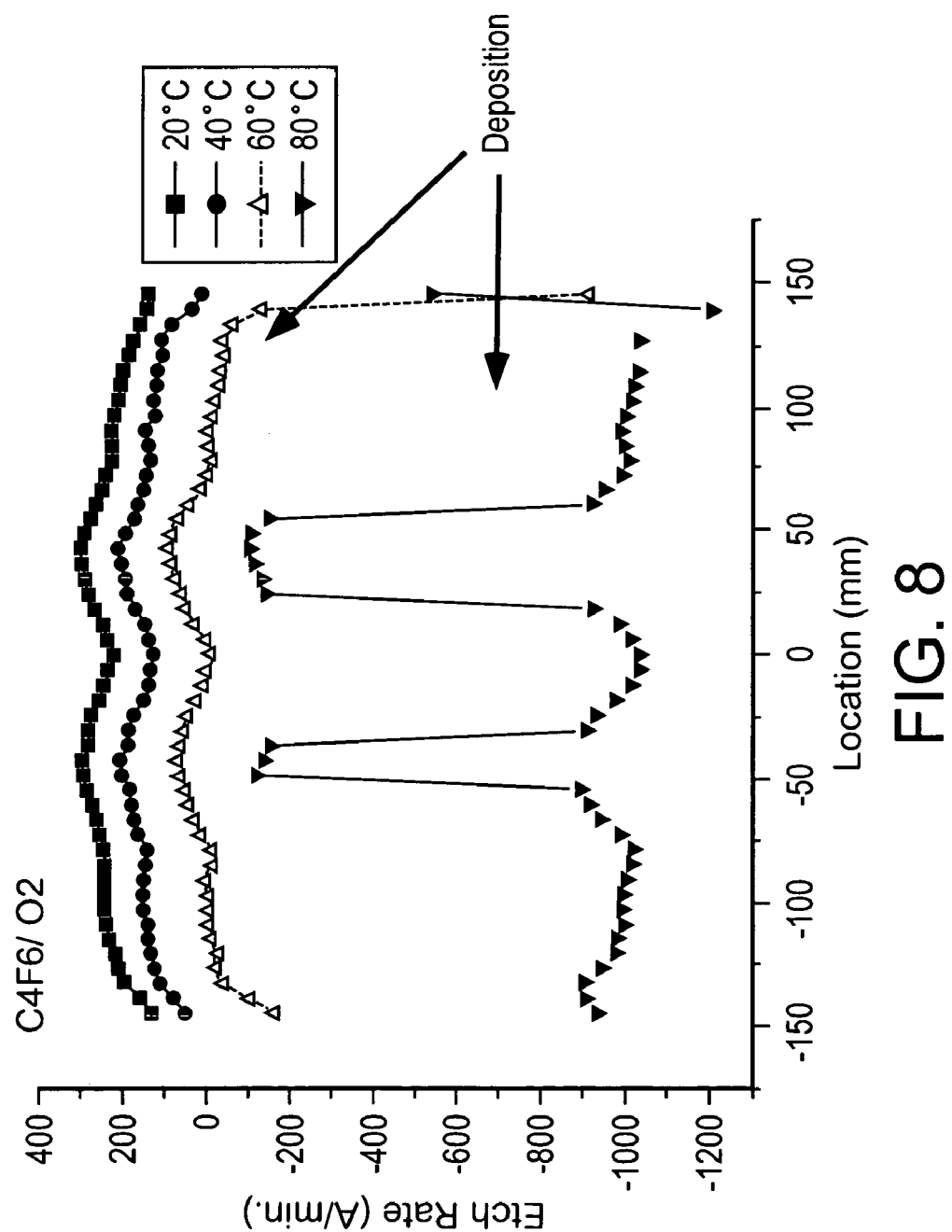
FIG. 8 illustrates the effect of showerhead electrode temperatures on an exemplary photoresist etch rate using a $C_4F_6$/$O_2$ etch gas.

This is further illustrated in FIG. 8, where the effect of an exemplary upper showerhead electrode temperature on a corresponding PR etch rate is depicted. In FIG. 8, a $C_4F_6/O_2$ etch gas is supplied for etching features in a silicon oxide layer through openings in a patterned PR, where the upper showerhead electrode has a temperature ranging from 20° C. to 80° C. and the showerhead temperatures measured at an edge region thereof. In FIG. 8, it is shown that the PR etch rate decreases from about 250 Å/min using a showerhead electrode at 20° C., to a negative etch rate (i.e., polymer buildup) since the etch rate becomes minus 1000 Å/min using a showerhead electrode is at 80° C.

Further, FIGS. 9a-d are photomicrographs which illustrate examples of upper electrode temperature effects (70° C. in FIG. 9a, 90° C. in FIG. 9b, 105° C. in FIG. 9c and 130° C. in FIG. 9d) on striations caused during etching. In FIG. 9a, which is the lowest temperature in the example at 70° C., compared to FIG. 9b, which is the second lowest temperature in the example at 90° C., the striations around the circumference of openings in the PR are reduced at the higher showerhead electrode temperature. This is further illustrated in FIGS. 9c and 9d, which progressively continue to increase in temperature to 105° C. and 130° C., respectively, and also show a decrease in striations around the circumference of the openings in the PR due to increased upper showerhead electrode temperature.

Thus, an upper showerhead electrode with an elevated temperature can lead to a reduction in the striations formed in a PR during plasma etching.

A. Heater

The heater 700 may include any type of active heater. Preferably, the heater 700 includes a metal plate with at least one resistance heating element, where the resistance heating element heats the plate to provide uniform heating of the upper showerhead electrode 200. Although any heater configuration may be used, a resistance heating element in combination with a thermally conductive plate is preferred, where the plate is preferably made of a metallic material, such as aluminum, an aluminum alloy, or the like, which is preferably machined to a shape compatible with the upper showerhead electrode 200. For instance, the heater 700 can include at least one resistance heating element in a plate of a cast aluminum alloy.

According to a preferred embodiment, heater 700 provides heat when a temperature controller 900 operates the power supply 250 to deliver power to the heater 700 where the temperature controller can vary a heater cycle time and state of heating through controlling the power supply 250. For example, a heater 700 can be powered by up to about 7000 watts with 10 or 12 second pulse cycles to maintain a threshold temperature of, for example, 80° C. to 200° C., e.g., 100° C. to 120° C., 120° C. to 140° C., 140° C. to 160° C., or 160° C. to 180° C., across the upper showerhead electrode 200.

The heater 700 is preferably in thermal contact (i.e., the heater indirectly contacts the top plate or one or more thermally conducting materials can be interposed between the heater and the top plate) with the top plate 800 with predetermined thermal interface properties. These thermal interface properties allow for the heater 700 to control, in combination with the top plate 800, the temperature in the upper showerhead electrode 200. It is noted that the heater may also be used as part of a thermal path to remove heat from the upper showerhead electrode 200 as needed, where the heater 700, in turn, can be cooled by the top plate 800. The heater 700 may also be attached to the top plate 800 with fasteners that may extend from outside the chamber through openings (not shown) in the top plate 800, in order for the top plate 800 to support the heater 700.

The heater 700 may also be activated during plasma processing of substrates, i.e., when plasma is being generated between the upper showerhead electrode 200 and the lower electrode. For example, during plasma processing operations that utilize relatively low levels of applied power to generate plasma, the heater 700 may be activated to maintain the temperature of the upper showerhead electrode 200 within a desired temperature range. During other plasma processing operations that utilize relatively high power levels, such as dielectric material etch processes, the upper showerhead electrode 200 temperature may remain sufficiently high between successive runs so that the heater 700 does not need to be activated to prevent the upper showerhead electrode 200 from falling below a minimum or threshold temperature.

Heat generated by a RF powered upper showerhead electrode 200 in a plasma processing apparatus may cause the upper showerhead electrode 200 to vary in temperature without the use of a heater. The combination of the heater 700 and the top plate 800 may be used in a preferred plasma processing apparatus to maintain an upper showerhead electrode 200 threshold temperature above a predetermined temperature, e.g., at or above 80° C., at or above 100° C., or even at or above about 150° C. depending upon the plasma processing requirements and the amount of heat generated by the upper showerhead electrode 200. Preferably, the combination of the heater 700 and the top plate 800 can be used to achieve and maintain a threshold temperature of the upper showerhead electrode 200 throughout processing of an initial wafer of a production run or maintain a threshold showerhead electrode temperature for each wafer processed during a production run wherein a batch of wafers is processed one-by-one in the chamber.

In order to minimize galling of the opposed surfaces between the heater 700 and the top plate 800 due to differential thermal expansion, a lubricating material 760 can be provided between the opposed surfaces of the heater 700 and the top plate 800. Alternatively, the lubricating material 760 can be provided between opposed surfaces of thermal chokes 750 and the heater 700 and between opposed surface of thermal chokes 750 and top plate 800. For example, as illustrated in FIG. 5, a layer of a lubricating material 760 can be placed between an upper surface of the heater 700 and a lower surface of the top plate 800. Preferably, the location of the lubricating material is on the atmosphere side of a vacuum seal defined by O-ring seals.

The lubricating material 760 preferably has a low level of contact resistance in order to minimize the galling caused by movement between the opposing surfaces. Additionally, the lubricating material 760 preferably has sufficient thermal conductivity to provide for sufficient heat transfer from the heater 700 to the top plate 800 and/or thermal chokes 750. It is noted that the lubricating material 760 can also be used on other component surfaces such as between opposed surfaces of the heater 700 and the insulator 600, and/or between the gas distribution member 500 and the upper showerhead electrode 200.

A preferred material that provides these properties is a graphite material, such as "GRAFOIL," which is commercially available from UCAR Carbon Co., Inc., Cleveland, Ohio. The lubricating material 760 is preferably a gasket having a preferred thickness of about 0.01 inch to about 0.06 inch, and more preferably about 0.03 inch. The lubricating material 760 is preferably a ring shaped gasket retained in an annular recess formed on a surface of a component, such as, for example, between the heater 700 and a thermal choke 750, and/or a thermal choke 750 and the top plate 800.

The heater 700 includes a heating element, which may preferably be a metallic heating element or a laminate with a resistively heated material disposed between opposed layers of a polymeric material. For example, a metallic heating element may be a heating element in a cast metal heater case or a heating element located in a channel formed in a heater. Alternatively, if a laminate heating element is used, the laminate should be able withstand the operating temperatures up to 200° C. reached by the heater 700. It is noted that if a laminate heating element is used, the insulator 600 may be optional as the laminate material in the laminate heating element may act as an electrical insulator. An exemplary polymeric material that may be used in the laminate is a polyimide sold under the trademark Kapton®, which is commercially available from E.I. du Pont de Nemours and Company.

The heater 700 may have one or more heating elements arranged in any suitable pattern that provides for thermally uniform heating across the upper showerhead electrode 200. For example, the heater 700 may have a regular or non-regular pattern of resistive heating lines such as a zig-zag, serpentine, or concentric pattern.

B. Top Plate

The top plate 800 preferably works in combination with the heater 700 to control the temperature of the upper showerhead electrode 200, where the top plate 800 may be used to cool the heater 700 and/or the upper showerhead electrode 200 via a thermal path passing through the heater 700. The top plate 800 may preferably be made of aluminum or an aluminum alloy, although any thermally conductive material may be used. When installed, the showerhead assembly preferably covers the underside of the top plate 800 inside the chamber.

The top plate 800 includes one or more flow passages through which a temperature-controlled fluid may be circulated. The temperature-controlled fluid is preferably a heat transfer fluid (liquid or gas), such as, for example, deionized water. Additionally, the top plate 800 preferably functions as an electrical ground, as well as a heat sink, for the apparatus 100, the heater 700 and/or the upper showerhead electrode 200, as may be desired.

C. Temperature Sensors

The apparatus 100 may include one or more temperature sensors 950, such as thermocouples or fiber optic arrangement to monitor the upper showerhead electrode 200 temperature. In a preferred embodiment, the temperature sensor(s) 950 are monitored by a temperature controller 900 which controls power from a power supply 250 to the heater 700 and/or controls fluid flow from a fluid control 850 through the top plate 800 as a function of the monitored temperature. Therefore, data provided by the temperature sensors 950 to the temperature controller 900 allows for the power supply 250 or the fluid control 850 to be activated by the temperature controller 900 to supply power or cooling fluid in a continuous or intermittent fashion to the heater 700 and/or the top plate 800, respectively so as to heat, cool or maintain the upper showerhead electrode 200 at or around a predetermined temperature or temperature range. As a result of the active heating and/or cooling, the temperature of the upper showerhead electrode 200 may be prevented from decreasing below a preset minimum temperature or threshold temperature or increasing above a preset maximum temperature, or may be held at or around a predetermined temperature.

D. Gas Distribution Member

The apparatus 100, as mentioned above, may also include a gas distribution member 500 located above and in fluid communication with the upper showerhead electrode 200. Preferably, by using an upper showerhead electrode 200 in combination with a gas distribution member 500, process gas can be delivered to one or more gas distribution zones above the substrate being processed. Moreover, the gas distribution member 500 can be used to distribute gas to the backside of the upper showerhead electrode 200 without requiring baffles to control the gas flow. See, for example, commonly assigned U.S. Pat. No. 6,508,913, which discloses a gas distribution system for processing a semiconductor substrate which includes a plurality of gas supplies and gas supply lines for delivering mixed gas to zones in a chamber, and is hereby incorporated by reference herein in its entirety.

A preferred embodiment of a gas distribution member 500 is illustrated in FIG. 10, wherein the gas distribution member 500 includes a radially or laterally extending circular metal plate 505 and an axially extending cylindrical hub 508, where both are preferably made of aluminum and are coaxially aligned at a contact area 170, so that gas provided to the axially extending hub 508 can pass through the metal plate 505 to one or more plenums at the backside of the showerhead electrode 200. The hub 508 and plate 505 can be formed from a single piece of material or multiple pieces of material which are bonded or mechanically fastened together. As illustrated in FIG. 4, the axially extending hub 508 and the metal plate 505 can be one piece of material. Alternatively, the plate 505 can comprise two overlapping plates bonded or mechanically fastened together, e.g., another metal plate 106 can be attached to a lower surface of plate 505 with gas channels therebetween for supplying process gas through outlets in plate 106 into a plenum or plenums between metal plate 106 and electrode 200, as illustrated in FIG. 4. Alternatively, an axially extending hub 508 and a separate metal plate 505 can comprise the gas distribution member 500, as illustrated in FIGS. 1 and 2.

Also, as illustrated in FIGS. 2 and 5, the gas distribution member 500 can be used to deliver RF power from a RF power supply 570 to the upper showerhead electrode 200, e.g., RF power from a RF generator can be supplied via a cable attached to a RF input connection on the hub 508 so that RF power may be supplied through the axially extending hub 508, the metal plate 505 and across the upper showerhead electrode 200.

In a preferred embodiment, the metal plate 505 includes cross-bores through its bulk in order to form an annular distribution conduits 151, radially extending gas passages 160 in fluid communication with conduits 151 and axially extending gas outlets 115, 122, 125 in fluid communication with passages 160. See FIGS. 10 and 11, for example. Likewise, the axially extending hub 508 is also preferably bored through its bulk to form one or more axially extending gas feeds 110, 120 as illustrated in FIG. 10. Using the gas feeds 110, 120, conduits 151, gas passages 160 and outlets 115, 122, 125, the gas distribution member 500 may provide gas distribution to one or more plenums at the backside of an upper showerhead electrode 200, wherein the gas passages 160 are connected to one or more gas feeds 110, 120 in the axially extending hub 508 through the conduits 151, as illustrated in FIG. 10. Thus, different process gas chemistries and/or flow rates can be applied to one or more zones across the substrate being processed.

In an embodiment, as distribution of gas flow can be accomplished without the use of baffles, e.g., the apparatus 100 may contain control points 128 to control the flow of gas from the gas supply 550 to the outlets 115, 122, 125. These control points 128 are preferably constrictor plates which can control the amount of gas flowing through control points 128 and thus the outlets 115, 122, 125, as illustrated in FIG. 10.

Preferably, the gas distribution member 500 includes one or more gas seals or barriers in contact with the upper showerhead electrode 200 in order to direct gas through the gas passages into one or more plenums at the backside of the upper showerhead electrode 200. For instance, an O-ring barrier 180, as illustrated in FIG. 10, between the underside of a metal plate 505 and the backside of an upper showerhead electrode 200 can be used to establish plenums between the metal plate 505 and the upper showerhead electrode 200, e.g., a central plenum 190 and an outer plenum 195.

The gas supply 550 can provide one or more individual gases or gas mixtures to respective plenums at the backside of the showerhead electrode 200. For example, inner and outer plenums can be supplied with different flow rates of the same process gas and/or different gases or gas mixtures to achieve a desired process gas distribution in the gap 400 during processing of a semiconductor substrate.

E. Insulator

The apparatus may also include an insulator 600, which is preferably thermally conductive but electrically insulating, and is more preferably a ceramic, such as aluminum nitride or boron nitride. This insulator 600 is useful for helping isolate RF power applied to an upper showerhead electrode 200 from other power sources and other electrically conductive parts associated with other power sources, such as of the heater 700. Therefore, the insulator 600 can allow for a heater 700 to be isolated electrically but placed in thermal contact with the upper showerhead electrode 200 so that the upper showerhead electrode 200 can be heated with decreased electrical interference between the AC or DC power of the heater and the RF power of the upper showerhead electrode 200.

The insulator 600 is preferably sized to substantially fill a region between the gas distribution member 500 and the heater 700, but can also be shaped to include a second portion 620 that electrically insulates an outer edge region of the gas distribution member 500. However, the insulator 600 is most preferably shaped to electrically insulate the heater 700 and other electrically conductive parts, such as the top plate 800, from the RF power applied to the upper showerhead electrode 200 and its associated electrically conductive RF supply path, such as the gas distribution member 500.

Additionally, the insulator is preferably sized to provide a predetermined level of electrical insulation for predetermined power levels. For example, an insulator layer 600 provided in a 2300 Exelan™ plasma chamber, manufactured by Lam Research Corporation, the assignee of the present application, can be sized to a thickness between 0.2 to 1.0 inch, more preferably 0.3 to 0.8 inch, e.g., 0.5 to about 0.75 inch.

F. Subassemblies

In order to structurally support the components of the apparatus 100, mechanical fasteners are employed to hold the components in place relative to one another. Preferably metal bolts are used as the mechanical fasteners, where the bolts are used to attach each of the components within the apparatus 100. Preferably, two separate subassemblies are used to simplify assembly of the apparatus 100, as well as to facilitate the maintenance and replacement of components within the apparatus 100.

In order to form the first subassembly, an upper showerhead electrode 200 is attached to the gas distribution member 500 by bolts passing through the gas distribution member 500 into threaded openings or threaded inserts in the backside of the showerhead electrode 200, which in turn is attached to the insulator 600 by bolts passing through the insulator 600 into threaded openings or threaded inserts in the backside of the gas distribution member 500. In order to form the second subassembly, the thermal chokes 750 are bolted to the top plate 800 by bolts passing through the top plate 800 into threaded openings or threaded inserts in the backside of the thermal chokes 750 and the top plate 800 is bolted to the heater 700 by bolts into threaded openings or threaded inserts in the backside of the heater 700. Then the first subassembly can be attached to the second subassembly by bolts passing through the top plate 800 and the heater 700 into threaded openings or threaded inserts in the backside of the insulator 600. In general, the second subassembly is intended to be used for a longer period from than first subassembly, i.e., the first subassembly can be replaced while the second subassembly remains in the apparatus.

Additionally, as mentioned above, a lubricating material is preferably provided in vacuum sealable regions between opposed surfaces of various components of the apparatus 100 to minimize galling.

Preferably, as illustrated in FIG. 12, the first subassembly 1000 includes bolts 225, which fasten the upper showerhead electrode 200 into the gas distribution member 500, and bolts 930 for fastening the gas distribution member 500 into the insulator 600. Further, the second subassembly 1100 preferably includes bolts 940 which fasten the top plate 800 to the thermal chokes 750 and bolts 910 which fasten the top plate 800 to the heater 700. Alternatively, thermal chokes 750 can be bolted by bolts 950 to the heater 700 prior to bolting the thermal chokes 750 to the top plate 800.

In a preferred embodiment, as illustrated in FIG. 12, the parts of the subassemblies 1000, 1100 include fasteners 900 located in stepped openings in lower surfaces of the parts to allow bolts from overlying parts to pass through aligned holes and thread into the fasteners. Details of such fasteners are provided on commonly-assigned U.S. patent application Ser. No. 10/623,540, the entire subject matter of which is hereby incorporated by reference.

While the invention has been described in detail with reference to specific embodiments thereof, it will be apparent to those skilled in the art that various changes and modifications may be made, and equivalents employed, without departing from the scope of the appended claims.

What is claimed is:

1. A showerhead electrode assembly, comprising:
   a showerhead electrode adapted to be mounted in an interior of a vacuum chamber and supply process gas to a gap in which plasma is generated between the showerhead electrode and a substrate support;
   a gas distribution member comprising an axially extending hub and a laterally extending metal plate attached to the showerhead electrode, the gas distribution member including a first gas passage which supplies process gas to a central plenum between the showerhead electrode and the metal plate and a second gas passage which supplies process gas to an outer plenum between the showerhead electrode and the metal plate;
   a thermal path member comprising a plate of electrically insulating material surrounding the hub and attached to the gas distribution member; and
   a heater comprising a plate of thermally conductive material surrounding the hub and attached to the thermal path member;
   wherein the heater transmits heat to the showerhead electrode through a thermal path comprising the gas distribution member and the thermal path member.

2. The showerhead electrode assembly of claim 1, wherein the thermal path member comprises an annular plate of a thermally conducting, electrically insulating material.

3. The showerhead electrode assembly of claim 1, wherein the thermal path member comprises a nitride material.

4. The showerhead electrode assembly of claim 1, wherein the thermal path member comprises aluminum nitride or boron nitride.

5. A vacuum chamber comprising the showerhead electrode assembly of claim 1, wherein the hub of the gas distribution member extends into an opening in a temperature controlled top wall of the vacuum chamber and the laterally extending metal plate of the gas distribution member extends completely over the showerhead electrode.

6. The vacuum chamber comprising the showerhead electrode assembly of claim 5, wherein the temperature controlled top wall of the vacuum chamber withdraws heat from the showerhead electrode via a thermal path passing through the heater, the thermal path member, the gas distribution member and the showerhead electrode.

7. The vacuum chamber comprising the showerhead electrode assembly of claim 5, wherein the showerhead electrode is a radio frequency (RF) powered electrode and said gas distribution member distributes RF power from the hub of the gas distribution member to the laterally extending metal plate of the gas distribution member and then to the showerhead electrode.

8. The vacuum chamber comprising the showerhead electrode assembly of claim 7, wherein the gas distribution member contacts 15 to 20% of the cross sectional area on the backside of the showerhead electrode.

9. The showerhead electrode assembly of claim 1, further comprising an annular ground electrode surrounding the showerhead electrode, the ground electrode including an exposed surface facing the gap and an electrical insulator is located between an inner periphery of the ground electrode and an outer periphery of the showerhead electrode.

10. A showerhead electrode assembly, comprising:
a showerhead electrode with a lower surface facing a substrate support and an upper surface facing away from the substrate support;
a gas distribution member comprising a laterally extending metal plate with a lower surface thereof attached to the upper surface of the showerhead electrode, an upper surface of the laterally extending metal plate facing away from the showerhead electrode, and an axially extending hub protruding from the upper surface of the gas distribution member, the gas distribution member including a first gas passage which supplies process gas to a central plenum between the showerhead electrode and the metal plate and a second gas passage which supplies process gas to an outer plenum between the showerhead electrode and the metal plate;
an electrical insulator plate with a lower surface attached to the upper surface of the gas distribution member and surrounding the axially extending hub of the gas distribution member and an upper surface facing away from the gas distribution member;
a top wall of a vacuum chamber with a lower surface attached to the upper surface of the electrical insulator plate, wherein the top wall and the electrical insulator plate are in thermal communication with the showerhead electrode; and
a gas supply connected to the axially extending hub of the gas distribution member and in gaseous communication with the showerhead electrode through gas passages extending through the gas distribution member.

11. The showerhead electrode assembly of claim 10, further comprising:
a heater located between the top wall and the gas distribution member;
thermal chokes located on the lower surface of the top wall;
contact points located on the lower surface of the gas distribution member and above the showerhead electrode;
a backing member located between the upper surface of the showerhead electrode and the lower surface of the gas distribution member, wherein a lower surface of the backing member is in contact with the upper surface of the showerhead electrode;
the first and second gas passages being in fluid communication with the central and outer plenums by radially extending passages within the gas distribution member; and
contact bolts mechanically fastening portions of the showerhead electrode assembly together.

12. A showerhead electrode assembly, comprising:
a showerhead electrode with a lower surface facing a substrate support and an upper surface facing away from the substrate support;
a gas distribution member with a lower surface attached to the upper surface of the showerhead electrode, an upper surface facing away from the showerhead electrode, and an axially extending hub protruding from the upper surface of the gas distribution member, the gas distribution member including a first gas passage which supplies process gas to a central plenum between the showerhead electrode and the metal plate and a second gas passage which supplies process gas to an outer plenum between the showerhead electrode and the metal plate;
an annular electrical insulator plate with a lower surface attached to the upper surface of the gas distribution member and surrounding the axially extending hub of the gas distribution member and an upper surface facing away from the gas distribution member;
a top wall of a vacuum chamber with a lower surface attached to the upper surface of the electrical insulator plate, wherein the top wall and the electrical insulator plate are in thermal communication with the showerhead electrode;
a gas supply connected to the axially extending hub of the gas distribution member and in gaseous communication with the showerhead electrode through gas passages extending through the gas distribution member; and
a heater plate located between the gas distribution member and the electrical insulator plate, wherein the electrical insulator plate directly contacts the heater plate, the heater plate directly contacts the gas distribution member and the gas distribution member directly contacts the showerhead electrode.

13. The showerhead electrode assembly of claim 12, further comprising:
first radially extending passages connected between the first gas passage and axially extending first gas outlets in communication with the central plenum, and second radially extending passages connected between the second gas passage and second axially extending gas outlets in communication with the outer plenum, the first and second gas passages extending axially through the hub.

* * * * *